(12) United States Patent
Bruce

(10) Patent No.: US 6,284,691 B1
(45) Date of Patent: Sep. 4, 2001

(54) YTTRIA-STABILIZED ZIRCONIA FEED MATERIAL

(75) Inventor: Robert W. Bruce, Loveland, OH (US)

(73) Assignee: General Electric Company, Cincinnati, OH (US)

( * ) Notice: Subject to any disclaimer, the term of this patent is extended or adjusted under 35 U.S.C. 154(b) by 0 days.

(21) Appl. No.: 09/491,567

(22) Filed: Jan. 26, 2000

Related U.S. Application Data

(62) Division of application No. 08/775,698, filed on Dec. 31, 1996, now Pat. No. 6,042,878.

(51) Int. Cl.$^7$ .................................................. C04B 35/48
(52) U.S. Cl. .......................................... 501/103; 501/104
(58) Field of Search ................................ 428/469, 472; 423/210, 592, 593, 608; 501/102, 103, 104

(56) References Cited

U.S. PATENT DOCUMENTS

| | | |
|---|---|---|
| 3,434,663 | 3/1969 | Hansen et al. . |
| 3,854,984 | 12/1974 | Schedler et al. . |
| 4,414,249 | 11/1983 | Ulion et al. ................. 427/248.1 |
| 4,676,994 | 6/1987 | Demaray . |
| 4,843,041 | 6/1989 | Pujari ............................. 501/95 |
| 4,880,614 | 11/1989 | Strangman ................. 427/248.1 |
| 5,015,502 | 5/1991 | Strangman ................... 427/250 |
| 5,236,151 | 8/1993 | Hagle et al. . |
| 5,236,745 | 8/1993 | Gupta et al. . |
| 5,238,752 | 8/1993 | Duderstadt et al. . |
| 5,254,413 | 10/1993 | Maricocchi . |
| 5,281,487 | 1/1994 | Rumaner et al. . |
| 5,316,666 | 5/1994 | Goldman et al. . |
| 5,350,599 | 9/1994 | Rigney et al. ................. 427/255.7 |
| 5,416,003 | 5/1995 | Bruce et al. . |
| 5,514,482 | 5/1996 | Strangman ................... 427/383.7 |
| 5,538,796 | 7/1996 | Schaeffer et al. ................. 427/532 |
| 5,556,713 | 9/1996 | Leverant ......................... 427/531 |
| 5,683,761 | 11/1997 | Bruce et al. ................. 427/419.2 |
| 5,683,825 | 11/1997 | Bruce et al. ................... 427/249 |
| 6,042,878 | 3/2000 | Bruce ............................ 427/126.2 |

FOREIGN PATENT DOCUMENTS

0812931A1 of 0000 (EP) .

OTHER PUBLICATIONS

Preparation and Characterization of Yttria–Stabilized Zirconia Powders by Solvent Extraction Process, by Chen Uli & Guo Gongyi. Ceramics International, GB, Elsevier Applied Science Publ, Barking, Essex, vol. 23, No. 3 pp. 267–272 XP004054870 ISSN 0272–8842, No Date.

*Primary Examiner*—Deborah Jones
*Assistant Examiner*—Bryant Young
(74) *Attorney, Agent, or Firm*—Andrew C. Hess; David L. Narcisco

(57) ABSTRACT

A method is provided for physical vapor deposition of ceramic thermal barrier coatings and articles made therefrom Impurity levels in conventional yttria stabilized zirconia source materials have caused undesired spitting (eruptions) due to a combined effect of various impurities thereby requiring relatively low evaporation rates to control the level of spitting during the process. The present method provides a high purity source material having a purity index sufficiently low to result in reduced spitting in the vapor deposition process and to permit in evaporation rates. Reducing the density of the source material has also been found to reduce spitting. The method permits higher processing rates and/or reduced levels of spitting.

19 Claims, 2 Drawing Sheets

YTTRIA-STABILIZED ZIRCONIA FEED MATERIAL

This is a division of patent application Ser. No. 08/775,698, filed Dec. 31, 1996, now U.S. Pat. No. 6,042,878.

BACKGROUND OF THE INVENTION

1. Field of the Invention

The present invention relates to physical vapor deposition methods and articles therefrom, and more particularly relates to ceramic vapor deposition methods and articles made therefrom.

2. Description of the Related Art

In the gas turbine engine art, popularly those developed for use in aircraft, high temperature operating component are exposed to strenuous oxidizing conditions during operation. Typical of such components are the blades, vanes and associated parts disposed in the turbine section of such engines. In order to extend the operating life of such articles, designers have specified coatings for application to article surfaces for oxidation as well as sulfidation protection.

One such coating has been reported as a thermal barrier coating system in a variety of forms. Generally, the thermal barrier coating is a ceramic type coating, examples of which include zirconia generally stabilized with yttria, magnesia or calcia. A preferred form of such a system includes a bond coating disposed between the substrate and the ceramic thermal barrier coating. Reported have been bond coatings of the M Cr Al type of alloy in which M is a metal selected from Fe, Ni, Co and their mixtures and alloys. Other elements including Y, rare earths, Pt, Rh, Pd, and Ht, and their combinations have been included in such an MCrAl alloy to enhance selected properties. Typical U.S. patents describing such a system or elements thereof include U.S. Pat. No. 4,055,705 Stecura, et al issued Oct. 25, 1977; U.S. Pat. No. 4,269,903 Clingman, et al issued May 26, 1981; U.S. Pat. No. 4,321,310 Ulion, et al issued Mar. 23, 1982; U.S. Pat. No. 4,321,311 Strangman issued Mar. 23, 1981; U.S. Pat. No. 4,335,190 Bill, et al issued Jun. 15, 1982; and U.S. Pat. No. 4,880,614 Strangman issued Nov. 14, 1989, all of which are incorporated herein by reference. Other bond coat systems such as aluminides and platinum modified aluminides are suitable. Bruce, et al U.S. Pat. No. 5,418,003 issued May 23, 1995 is incorporated herein by reference, and discloses vapor deposition of ceramic materials involving (a) furnishing an ingot of a ceramic material, (b) treating the ingot to reduce sources of gas within the ingot and (c) evaporating the ceramic material in the ingot by melting the surface of the ingot with an intense heat source; the evaporated ceramic is then deposited upon a substrate as the ceramic coating. Bruce discloses that the reduced gas content of the ingot decreases the incidence of spitting and eruptions from the molten surface of the ingot, thereby improving the quality of the deposited coating and facilitating increases in evaporation rates and coating process production rates. The gas can be trapped in closed pore voids, on surfaces and in cracks in the source material.

SUMMARY OF THE INVENTION

A method is provided for physical vapor deposition of ceramic thermal barrier coatings and articles made therefrom. Impurity levels in conventional yttria stabilized zirconia source materials have caused undesired spitting (eruptions) due to a combined effect of various impurities thereby requiring relativity low evaporation rates to control the level of spitting during the process. The present method provides a high purity source material having a purity index sufficiently low to result in reduced spitting in the vapor deposition process and to permit increased evaporation rates. Reducing the density of the source material has also been found to reduce spitting. The method permits higher processing rates and/or reduced levels of spitting.

DETAILED DESCRIPTION OF THE INVENTION

Figure 1:
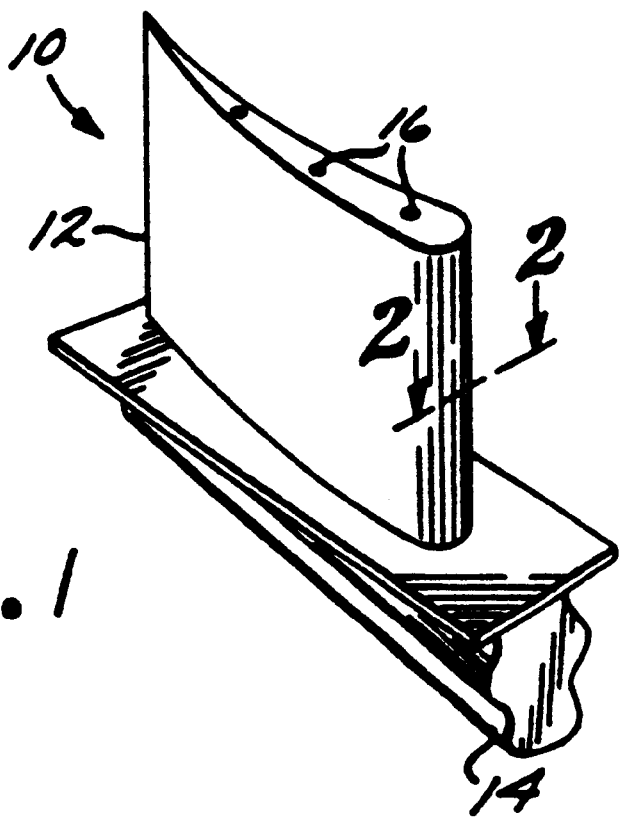
FIG. 1 is a perspective view of a turbine blade having a metallic protective coating.

While the above coating techniques can provide thermal barrier coatings, these processes, depending upon the materials being used, can suffer from one or more of the following problems (a) raw material impurities, (b) relatively expensive high purity raw materials, (c) relatively slow production rates and for (d) undesirably high levels of material spitting (eruptions). Low melting point impurities are another source of gas/vapor that causes spitting and eruptions. extraction and skull melting processes. The coating is preferably applied as an overlay coating to a substrate to form a desired coated article. One such article is a coated jet engine gas turbine blade 10 as illustrated in FIG. 1. The substance of the blade 10 may be fonted of any suitable alloy, including superalloys. One example of such a superalloy is RENE' 80, a well known nickel-base superalloy which has a nominal composition, in weight percent, of 14 percent chromium, 9.5 percent cobalt, 5 percent titanium, 4 percent tungsten, 4 percent molybdenum, 3 percent aluminum, 0.17 percent carbon 0.06 percent, zirconium 0.015 percent boron, and the balance nickel. Another example is a more advanced nickel-base superalloy such as RENE' N4, having a nominal composition, in weight percent of 7.5 cobalt, 9.0 chromium, 3.7 aluminum, 4.2 titanium, 1.5 percent molybdenum, 4.0 percent tantalum, 6.0 percent tungsten, 0.5 percent niobium, and balance nickel. These sure superalloys are presented as examples, and the coatings and processes are not limited for use with these substrates.

Figure 2:
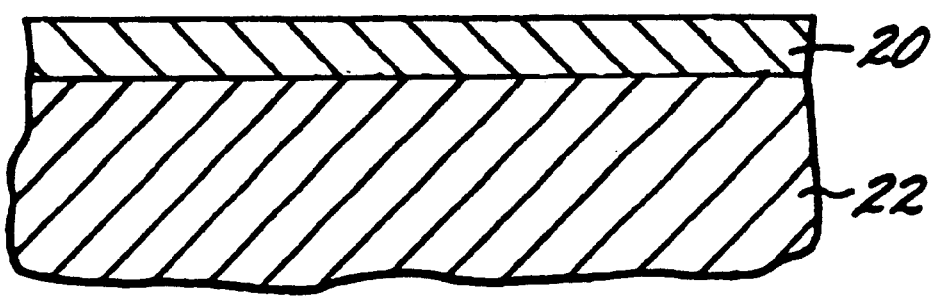
FIG. 2 is an enlarged sectional view of the turbine blade of FIG. 1 taken along lines 2—2.
Figure 3:
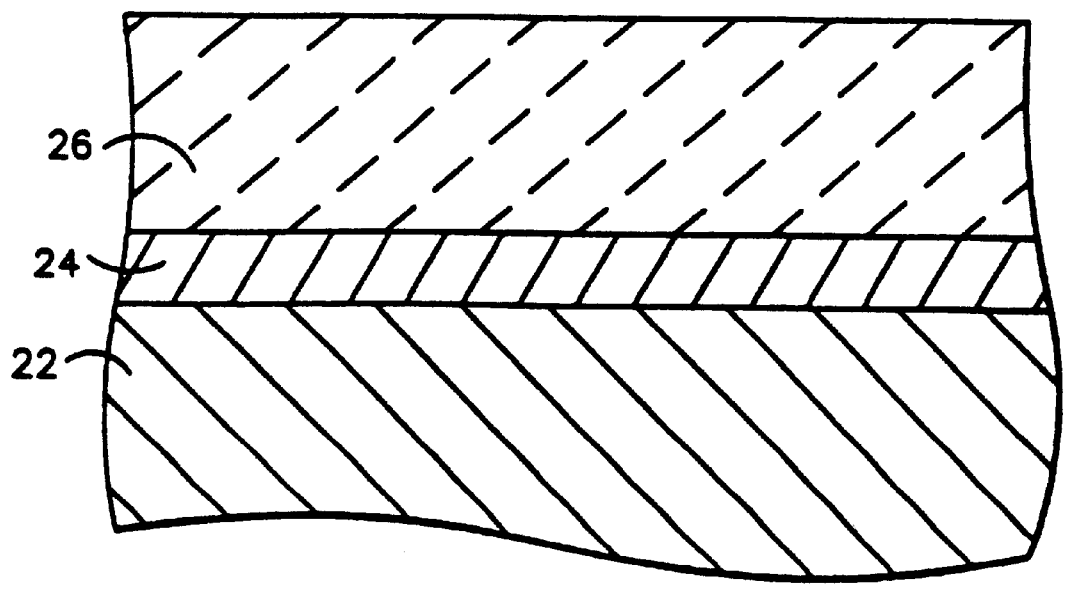
FIG. 3 is a sectional view similar to that of FIG. 2, with a thermal barrier coating overlying the metallic coating.

As shown in FIGS. 1, 2, and 3 the blade (10) has various layers. Such a blade (10) includes an airfoil section (12) against which hot combustion gases are directed when the engine operates, and whose surface is subjected to severe oxidation and corrosion attack during service. If the surface of the airfoil section (12) is not protected against oxidation and corrosion in some fashion, it will last at most only a few cycles of operation. The airfoil section (12) is anchored to a turbine disk (not shown) through a root section (14). In some cases, cooling passages (16) are present in the airfoil section (12), through which cool bleed air is forced to remove heat from the blade (10). The blade (10) is normally prepared by a casting and solidification procedure well know to those skilled in the art, such as investment casting or, more preferably, directional solidification or single crystal growth.

The airfoil section (12) is protected by a metallic protective coating (20), as illustrated in detail in FIG. 2, which depicts an enlargement of a section through the surface portion of the blade (10). The (nickel-base) superalloy of the blade (10) forms a substrate (22) upon which and over which the coating (20) is deposited. A ceramic thermal barrier coating (26) is applied overlying the bond coating (24). The yttria stabilized zirconia source material used for the deposition process is preferably in the form of an ingot. The number of spits found on coated parts correlates with the spit (eruption) count in the pool, and ingot quality is the leading cause of spitting and eruptions. A six-fold reduction in spitting caused by ingot allows for a two-fold increase in evaporation rate with the same level of spits on parts. Vacuum heat treating a high purity ingot can further improve the purity of the ingot. For example vacuum heat treating the ingot to 1832° F. (about 1000° C.) at ramp rates from 5° F./minute to 10° F./minute (about 2.8° C./minute to about 5.6° C./minute) shows three to six-fold improvements over nonheat treated ingots. Lower firing temperatures of the ingot, leading to lower density of the ingot, have been shown to reduce spitting. Spitting and eruptions, the most severe form of spitting, causes spits (a mass of ceramic material) to form in the coating, which can then separate from the surface during cyclic thermal exposure, leaving pits that can lead to spallation due to thermal and oxidative exposure of the bond coat, and these pits can also lead to increased erosion of the thermal barrier coating. Undesired levels of spitting and eruptions cause control problems during the evaporation process, limiting the evaporation rate. The present process which uses a reduced spitting ingot permits increased evaporation and coating rates. Alternatively, the present process may use pellets or powder as the starting material (source material).

The source material of the present process has a relatively low impurity index, preferably less than 7000, more preferably less than 6200, and most preferably less than 5000. The impurity index is a measure of impurity taking into account a weighted factoring of impurity levels based on their spitting tendency. The impurity index is calculated for yttria stabilized zirconia as follows: $8\times Ca$ (typically in the form of CaO)+$7\times C$+$7\times Fe$ (typically in the form of $Fe_2O_3$)+$7\times Si$ (typically in the form of $SiO_2$)+$7\times Ti$ (typically in the form of $TiO_2$)+$7\times S$+$5\times Mg$ (typically in the form of MgO)+$5\times Na$ (typically in the form of $Na_2O$)+$4\times Bi$ (typically in the form of $Bi_2O_3$)+$3\times Al$ (typically in the form of $Al_2O_3$)+$2\times P$ (typically in the form of $P_2O_5$)+$2\times Ta$ (typically in the form of $Ta_2O_5$) wherein the amounts of the various impurities (elements) are based on the total weight of the source material. The correlation between the impurity index and the spitting appears to be relatively linear. Yttrium and hafnium levels should also be controlled to minimize spitting. The source material (ingot) preferably also has a reduced density level to improve production rates and reduce spitting and eruptions. Conventional ingot densities have run from 3.6 grams per cubic centimeter (g/cc) to 4.0 g/cc. According to this invention, suitable densities are less than 3.6 g/cc, preferably not greater than 3.5 g/cc, and more preferably not greater than 3.2 g/cc. An example of a suitable range is 3.2 to 3.5 g/cc. Lower maximum firing temperature is one way of obtaining lower density. The structures may contain or be free of other layers, and the materials may contain or be free of various compounds. The following examples are not meant to limit the scope of the present invention.

EXAMPLES

A frist conventional purity yttria stabilized zirconia the following ppm of impurities: C(21 ppm), Na(35 ppm), Mg(27 ppm), Al(64 ppm), Si(68 ppm), P(66 ppm), S(32 ppm), Ca(57 ppm), Ti(510 ppm), Fe(43 ppm), Ta(760 ppm), Bi(0.13 ppm) providing an impurity index of $7\times 210+5\times 35+5\times 27+3\times 64+7\times 68+2\times 66+7\times 32 +8\times 57+7\times 510+7\times 43+2\times 760+4\times 0.13=8651$, and yield a high level of spitting during vapor deposition thereby effectively limiting the vapor deposition rate.

A higher purity ingot (IC1) (based on the impurity index) was obtained by combining high purity ingot composition with further heat treatment to remove volatiles. The combined effect of improving purity with regard to volatiles and nonvolables yielded a source material having C(140 ppm), Na(12 ppm), Mg(13 ppm), Al(52 ppm), Si(45 ppm), P(40 ppm), S(39 ppm), Ca(61 ppm), Ti(510 ppm), Fe(13 ppm), Ta(21 ppm) and Bi(0.048 ppm) yielding an impurity index of 6129.

An even higher purity ingot (IC2) was obtained and heat treated to yield a source material having a low impurity index. The source material had the following elemental impurity levels C(77 ppm), Na(20 ppm), Mg(9 ppm), Al(58 ppm), Si(32 ppm), P(39 ppm), S(15 ppm), Ca(54 ppm), Ti(450 ppm), Fe(9 ppm), Ta(12 ppm) and Bi(0.087 ppm) yielding an impurity index of 4938.

The spitting level of ICA was approximately 50% greater than that of IC1 and was approximately 4 times as great as IC2. In other words the present process involving utilization of a low impurity index source material results reduced spitting and permits enhanced production rates.

This invention has been described in connection with specific embodiments and examples. However, it will be readily recognized by those skilled in the art the various modifications and variations of which the present invention is capable without departing from its scope as defined by the appended claims.

What is claimed is:

1. A solid feed material of yttria stabilized zirconia having an impurity index of less than 7000, said impurity index being determined by the formula $$\text{impurity index}=8\times Ca+7\times C+7\times Fe+7\times Si+7\times Ti+7\times S+5\times Mg+5\times Na+4\times Bi+3\times Al+2\times P+2\times Ta$$

wherein elemental values are in parts per million by weight based on the total weight of feed material.

2. The feed material of claim 1 wherein the feed material is an ingot.

3. The feed material of claim 1 wherein the feed material comprises pellets or a powder.

4. The feed material of claim 1, wherein the feed material has a density of not greater than 3.5 g/cc.

5. The feed material of claim 1, wherein the feed material has a density of not greater than 3.2 g/co.

6. The feed material of claim 1, wherein the feed material has a density of between 3.2 g/cc and 3.5 g/cc.

7. The feed material of claim 1, wherein the feed material has a carbon level of not greater than 0.05 percent by weight based on the total weight of the feed material.

8. The feed material of claim 1, wherein the feed material has an iron level of not greater than 0.05 percent by weight based on the total weight of the feed material.

9. The feed material of claim 1, wherein the feed material has a magnesium level of not greater than 0.05 percent by weight based on the total weight of the feed material.

10. The feed material of claim 1, wherein the feed material has a calcium level of not greater than 0.05 percent by weight based on the total weight of the feed material.

11. The feed material of claim 1, wherein the feed material has a silicon level of not greater than 0.05 percent by weight based on the total weight of the feed material.

12. The feed material of claim 1, wherein the feed material has a titanium level of not greater than 0.01 percent by weight based on the total weight of the feed material.

13. The feed material of claim 1, wherein the feed material has a sodium level of not greater than 0.05 percent by weight based on the total weight of the feed material.

14. The feed material of claim 1, wherein the feed material has a bismuth level of not greater than 0.0003 percent by weight based on the total weight of the feed material.

15. The feed material of claim 1, wherein the feed material has a sulfur level of not greater than 0.02 percent by weight based on the total weight of the feed material.

16. A solid feed material of yttria stabilized zirconia having an impurity index of less than 5000, said impurity index being determined by the formula $$\text{impurity index} = 8 \times Ca + 7 \times C + 7 \times Fe + 7 \times Si + 7 \times Ti + 7 \times S + 5 \times Mg + 5 \times Na + 4 \times Bi + 3 \times Al + 2 \times P + 2 \times Ta$$

wherein elemental values are in parts per million by weight based on the total weight of feed material, and wherein the feed material has a density of less than 3.6 g/cc.

17. The feed material of claim 16, wherein the feed material has a density of between 3.2 g/cc and 3.5 g/cc.

18. The feed material of claim 16, wherein the feed material has a density of not greater than 3.2 g/cc.

19. The feed material of claim 16, wherein the feed material has, by weight based on the total weight of the feed material, a carbon level of not greater than 0.05 percent, an iron level of not greater than 0.05 percent, a magnesium level of not greater than 0.05 percent, a calcium level of not greater than 0.05 percent, a silicon level of not greater than 0.05 percent, a titanium level of not greater than 0.01 percent, a sodium level of not greater than 0.05 percent, a bismuth level of not greater than 0.0003 percent, and a sulfur level of not greater than 0.02 percent.

* * * * *